United States Patent
Shan et al.

(10) Patent No.: US 6,365,015 B1
(45) Date of Patent: *Apr. 2, 2002

(54) METHOD FOR DEPOSITING HIGH DENSITY PLASMA CHEMICAL VAPOR DEPOSITION OXIDE IN HIGH ASPECT RATIO GAPS

(75) Inventors: Jessie C. Shan, Vancouver; Chang-Kuei Huang, Camas; Steve H. Y. Yang, Vancouver, all of WA (US)

(73) Assignee: Wafertech, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/597,933

(22) Filed: Jun. 19, 2000

Related U.S. Application Data

(63) Continuation of application No. 09/199,835, filed on Nov. 25, 1998, now Pat. No. 6,129,819.

(51) Int. Cl.[7] .............. C23C 14/34; H01L 21/4763; H01L 21/311; H01L 21/31
(52) U.S. Cl. .............. 204/192.3; 438/714; 438/633; 438/759; 438/695; 438/624
(58) Field of Search .............. 204/192.3, 192.32, 204/192.34, 192.37; 438/714, 759, 695, 633, 624

(56) References Cited

U.S. PATENT DOCUMENTS

| | | | | |
|---|---|---|---|---|
| 4,732,761 A | * | 3/1988 | Machida et al. | 204/192.23 |
| 5,279,865 A | * | 1/1994 | Chebi et al. | 427/574 |
| 5,679,606 A | * | 10/1997 | Wang et al. | 438/763 |
| 5,814,564 A | * | 9/1998 | Yao et al. | 438/723 |
| 5,913,140 A | * | 6/1999 | Roche et al. | 438/624 |
| 5,920,792 A | * | 7/1999 | Lin | 438/633 |
| 6,093,634 A | * | 7/2000 | Chen et al. | 438/622 |
| 6,129,819 A | * | 10/2000 | Shan et al. | 204/192.3 |
| 6,136,685 A | * | 10/2000 | Narwankar et al. | 438/624 |
| 6,153,543 A | * | 11/2000 | Chesire et al. | 438/791 |

* cited by examiner

Primary Examiner—Nam Nguyen
Assistant Examiner—Gregg Cantelmo
(74) Attorney, Agent, or Firm—Blakely Sokoloff Taylor & Zafman LLP

(57) ABSTRACT

A method of forming a HDPCVD oxide layer over metal lines, the metal lines having gaps between the metal lines having an aspect ratio of two or more. The method comprises the steps of: forming a liner oxide layer over the metal lines; and forming an HDPCVD oxide layer over the liner oxide layer, the formation of the HDPCVD oxide layer being done such that the deposition-to-sputter ratio is increasing as the gaps are being filled.

1 Claim, 2 Drawing Sheets

METHOD FOR DEPOSITING HIGH DENSITY PLASMA CHEMICAL VAPOR DEPOSITION OXIDE IN HIGH ASPECT RATIO GAPS

RELATED APPLICATIONS

This is a continuation of U.S. patent application Ser. No. 09/199,835 filed Nov. 25, 1998, now U.S. Pat. No. 6,129,819 issued Oct. 10, 2000 priority of which is hereby claimed under 35 U.S.C. §120.

FIELD OF THE INVENTION

The present invention relates to the deposition of high density plasma chemical vapor deposition (HDPCVD) oxides, and more particularly, to a method of depositing HDPCVD oxide without the formation of seams, defects, or other discontinuities in high aspect ratio gap filling applications.

BACKGROUND OF THE INVENTION

Metal interconnect structures are an important part of VLSI integrated circuits. The metal interconnect structures typically include metal lines and vias. The vias are used to interconnect the metal lines with conductive structures above and below the metal interconnect layer. Sophisticated ICs may include several layers of metal interconnect structures. The metal lines are commonly used on VLSI integrated circuits for carrying digital signals, analogs signals, or bias power to and from the embedded semiconductor devices.

As integration densities increase, and feature sizes decrease, the aspect ratio of the gaps between adjacent metal lines increases. Currently, the aspect ratios of the gaps between adjacent metal lines are approaching two. For example, the height of a metal line may be on the order of 1.0 microns, whereas the spacing between the metal lines may approach 0.5 microns.

Typically, after the metal lines have been formed through metal etching, a dielectric layer is deposited over the metal lines for insulation purposes. This dielectric layer is referred to as either an intermetal dielectric (IMD), or an interlayer dielectric (ILD). The insulating dielectric layer typically is formed from a composite of multiple layers of oxide. For example, in many processes, the insulative dielectric layer comprises a bulk oxide layer followed by a cap oxide layer.

As the aspect ratios of the gaps between metal lines increases, it has been found that conventional chemical vapor deposition of oxides oftentimes fail to exhibit acceptable gap filling characteristics. Imperfections and discontinuities such as keyholes and incomplete filling occur.

One type of oxide that has demonstrated encouraging gap filling capabilities is the high density plasma chemical vapor deposition (HDPCVD) oxide. HDPCVD oxide technology has only been recently developed in the past few years. Thus, although HDPCVD oxide remains a promising gap filling alternative for high aspect ratio gaps, difficulties have been found in the practical application of the HDPCVD oxide technology.

For example, turning to FIG. 1, a phenomena known as "corner clipping" occurs during deposition of the HDPCVD oxide. In FIG. 1, metal lines 103 are formed atop a substrate 101. The substrate 101 is understood to possibly include a semiconductive wafer, active and passive devices formed within the wafer, and layers formed on the wafer's surface. Thus, the term "substrate" is meant to include devices formed within a semiconductor wafer and the layers overlying the wafer.

The metal lines 103 are typically formed from either copper or aluminum. Atop the metal line 103 is a titanium nitride layer 105. As is known by those of ordinary skill in the art, the titanium nitride layer 105 is commonly used as an anti-reflection coating (ARC) during the etching of the metal lines 103.

When a gap filling HDPCVD oxide 107 is deposited over the titanium nitride layer 105 and the metal lines 103, the corners of the titanium nitride layer 105 along the edges of the metal lines 103 exhibit erosion, which is referred to as corner clipping. Thus, the HDPCVD oxide layer 107, while filing the gaps between the metal lines 103, tends to erode the corners of the titanium nitride layer 105. This phenomena has been particularly seen using the Applied Materials model Ultima 5200 HDPCVD Century ("Ultima") apparatus. The corner clipping effect raises additional issues during later process integration steps.

The mechanism by which the HDPCVD oxide is formed is by a combination of deposition and sputtering (also known as "sputter-etch" or simply "etch" in the art). The deposition process of the Ultima apparatus results from a low frequency RF power source that drives the silicon (from silane) and oxygen ions towards the surface of the wafer to form a silicon oxide. The sputtering process of the Ultima apparatus results from a high frequency bias power that drives inert gas ions (typically argon) towards the surface of the wafer. As can be appreciated by those skilled in the art, sputtering in the HDPCVD oxide art refers to the process of bombarding deposited oxide with inert gas ions in order to dislodge oxide particles. Thus, the deposition process forms oxide on the wafer and the sputtering process dislodges and rearranges the deposited oxide on the wafer.

By varying the deposition-to-sputter ratio (D/S), different gap filling properties may be achieved. For high aspect ratio gaps, typically, an aggressive D/S ratio is used to fill the gaps. For example, it is not uncommon for a D/S ratio of 3 to be used with the Ultima apparatus. However, as seen in FIG. 1, this particular "recipe" results in corner clipping. Another disadvantage of this low D/S ratio is that the throughput is relatively low. In other words, it requires a relatively long time to achieve the formation of the HDPCVD oxide.

It has been contemplated to use a two-step process for the formation of the HDPCVD oxide. However, this approach has also shown limited success. For example, turning to FIG. 2, experiments have indicated that the two-step process of forming the HDPCVD oxide gives rise to vertical seams 109 that will cause difficulties when a later cap oxide layer is deposited. The vertical seams 109 are due to the uneven gap filling from the center to the edge of a wafer. In most cases, the edge area of the wafer has the gap filling beneath the top of the metal line. Further, there is a sharp interface between the first HDPCVD oxide layer 111 and the second HDPCVD oxide layer 113. The sharp interface also tends to weaken the integrity of the HDPCVD oxide. Moreover, other imperfections, voids, and gaps 115 also have been shown to arise.

The vertical seams 109 are particularly prevalent at the peripheral regions of a wafer. This is believed to result from the well-known effect of having uneven oxide deposition thicknesses over the wafer surface. This is believed to result from the gas nozzle design of the currently commercially available HDPCVD systems.

The present invention is directed towards a method of depositing HDPCVD oxide into high aspect ratio gaps in such a manner so as to eliminate the problems of the prior art.

SUMMARY OF THE INVENTION

A method of forming a HDPCVD oxide layer over metal lines, said metal lines having gaps between said metal lines having an aspect ratio of two or more, is disclosed. The method comprises the steps of: forming a liner oxide layer over said metal lines; and forming an HDPCVD oxide layer over said liner oxide layer, said formation of said HDPCVD oxide layer being done such that the deposition-to-sputter ratio is increasing as said gaps are being filled.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the HDPCVD oxide of the present invention was experimentally performed on the Ultima apparatus. That apparatus uses gas nozzles on the sides of the wafer and also from above the wafer to supply the silane, oxygen, and argon gas for the HDPCVD oxide forming process. The optimal D/S ratio range for the Ultima apparatus is from 2.8 to 6. The formation of the HDPCVD oxide is formed by flowing silane ($SiH_4$) in combination with oxygen. By controlling the flow rate of the silane and the oxygen at the side nozzles and the top nozzles, the deposition rate of the HDPCVD oxide can be changed. Further, by controlling the high frequency bias power and the argon gas flow rate, the sputtering rate can be adjusted. Thus, by combining control of the sputter rate and the deposition rate, the D/S ratio can be calculated and controlled.

Although the prior art teaches the use of a single D/S ratio for forming the complete HDPCVD oxide layer, the inventors of the present invention have discovered that by varying the D/S ratio during the formation of the HDPCVD oxide, the deficiencies of the prior art are avoided.

Figure 1:
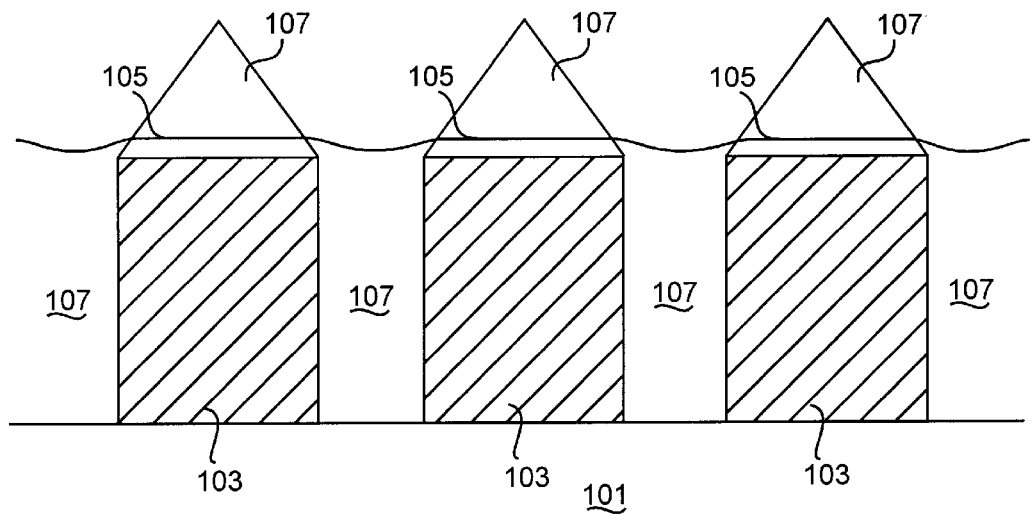
FIG. 1 is a cross-sectional view of a semiconductor substrate having HDPCVD oxide gap filling in accordance with the prior art.
Figure 2:
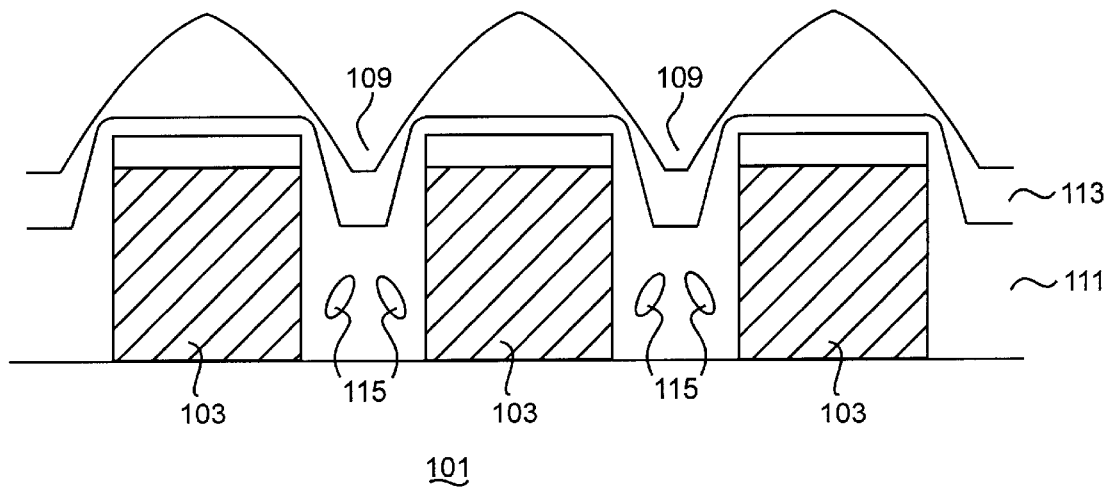
FIG. 2 is a cross-sectional view of a semiconductor substrate illustrating the deficiencies in a two-step process for forming HDPCVD oxide.
Figure 3:
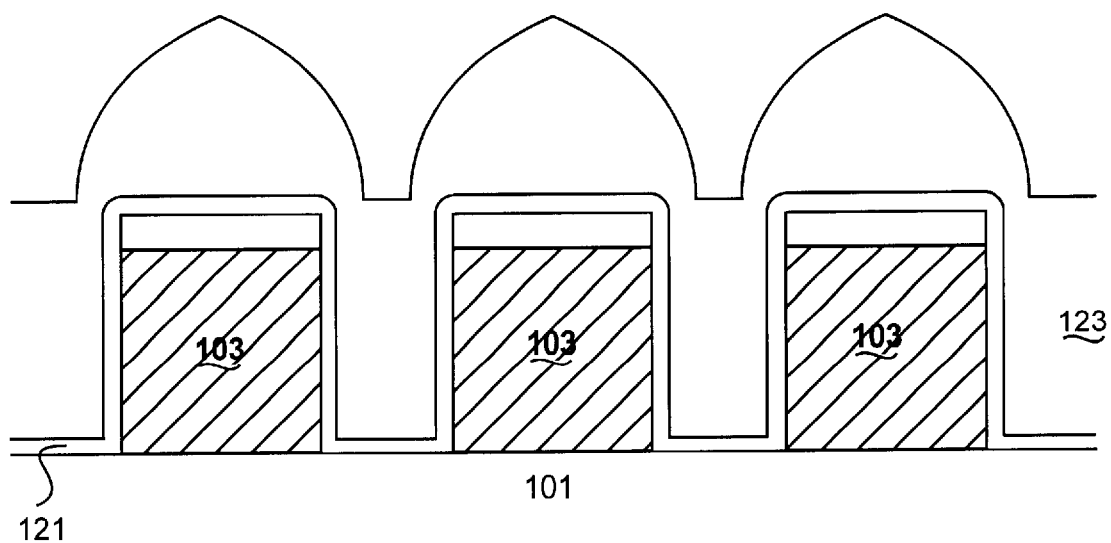
FIG. 3 is a cross-sectional view of a semiconductor substrate showing the deposition of HDPCVD oxide in accordance with the present invention.

Specifically, turning to FIG. 3, in accordance with the present invention, a liner oxide 121 is first formed over the metal lines 103. The liner oxide preferably has a thickness on the order of 1,000 angstroms and is formed only by deposition. In other words, the sputtering technique is not used in forming the liner oxide. In the Ultima apparatus, the sputtering can be eliminated by turning off the high frequency bias power and by shutting off argon gas flow. The liner oxide serves to protect the metal lines 103 and titanium nitride from the harmful side effects of forming the HDPCVD oxide layer.

In an actual example, the height of the metal lines 103 is on the order of 10,000 angstroms. The distance between metal lines is on the order of 5,000 angstroms. Therefore, the aspect ratio of the gaps between the metal lines 103 is about 2. Note also, that although in one actual example, the aspect ratio is 2, it can be appreciated that the present invention can be used in even higher aspect ratio gaps.

After the liner oxide 121 has been deposited, the remaining 9000 angstroms of oxide is deposited continuously at four incremental levels with increasing flow rates for silane and oxygen to accommodate a higher D/S ratio. Thus, for the next 22% of the remaining 9000 angstroms, a D/S ratio of 3 is employed. This aggressive D/S ratio, if maintained as in the prior art too long, will result in corner clipping. Therefore, in accordance with the present invention, the D/S ratio is increased. It has been found that the maximum amount of HDPCVD oxide that should be deposited using a D/S ratio of 3 without corner clipping is 3,500 angstroms.

For the next 25% of the remaining height of the gap, a D/S ratio of 4 is used. Similarly, for the following 25% of the gap height, a D/S ratio of 5 is used. Finally, for the last 28% of the gap height, a D/S ratio of 6 is used. By gradually increasing the D/S ratio as the gap is filled, the elimination of an interface seam is possible. Therefore, as seen in FIG. 3, the HDPCVD oxide layer 123 is a continuous layer of HDP-CVD oxide without any interface seams. Further, it has been found that by increasing the D/S ratio as a gap is being filled will eliminate corner clipping and other defects, as well as providing complete gap filling over the entire surface of the wafer.

As can be appreciated by those skilled in the art, there can be many adjustments to the process recipe that will change the D/S ratio. One can increase the deposition rate by increasing the silane and oxygen flow rate, which will cause the D/S rate to increase. Alternatively, one can lower the sputter rate by adjusting the high frequency bias power or the argon gas flow rate.

For the Ultima apparatus, the following flow rates for silane and oxygen for the side and top nozzles of the apparatus have been found to provide the desired D/S ratios of 3, 4, 5, and 6 at a high frequency bias power of 3000 watts, respectively:

|  |  | D/S3 | D/S 4 | D/S 5 | D/S 6 |
| --- | --- | --- | --- | --- | --- |
| $SiH_4$ (sccm) | side | 45–60 | 55–75 | 70–90 | 85–100 |
|  | top | 8.5–15 | 8.5–15 | 8.5–15 | 8.5–15 |
| O2 (sccm) | side | 90–150 | 90–150 | 130–200 | 130–200 |
|  | top | 10.5–20 | 10.5–22.6 | 17.5–32 | 22.5–38 |

Note also that the plasma power is kept constant throughout the HDPCVD oxide deposition. In particular, preferably, the RF power for the top is between 1300 to 1700 watts, for the side is between 2800 to 3500 watts, and for the bias power is between 2700 to 3500 watts. During the sputtering process, the argon gas flow rate for the top nozzle is preferably 16 sccm and the side nozzle is preferably 110 sccm. Furthermore, preferably the pressure in the deposition chamber is in the millitorr range. This can be accomplished by pumping down the chamber and setting the throttle valve of the Ultima apparatus in the fully open position. Finally, prior to the beginning of the deposition process, the power is ramped up from 1000 watts to 2700 watts range.

As noted above, it has been found that increasing the D/S ratio while filling the gaps provides complete gap filling throughout the entire wafer and does not leave vertical seams. Thus, the wafer surface at the periphery of the wafer and the wafer surface at the center of the wafer all show complete gap filling.

For aspect ratios of two or greater, it has been found that a minimum of four discrete D/S ratios are necessary in order to avoid the problems of the prior art. However, it has also been found that even smaller incremental steps in the changing of the D/S ratio may be used. For example, five or more distinct D/S may be implemented during the process of filling the gap. The important principle of the present invention is that the D/S ratio should be increased as the gap filling process takes place.

While the preferred embodiment of the invention has been illustrated and described, it will be appreciated that various changes can be made therein without departing from the spirit and scope of the invention.

What is claimed is:

1. A method of forming an HDPCVD oxide layer into high aspect ratio gaps using a HDPCVD oxide formation process, the HDPCVD oxide process having a deposition-to-sputter ratio, the method comprising:

flowing silane and oxygen into a single HDPCVD reaction chamber; and adjusting the silane and oxygen flow rates to discretely and sequentially increase the deposition-to-sputter ratio of the HDPCVD oxide formation process to at least three different sequentially increasing deposition-to-sputter ratios during the formation of the HDPCVD oxide layer while in a single HDPCVD process chamber and until the HDPCVD oxide layer is formed.

* * * * *